United States Patent [19]

Bartholomew et al.

[11] 4,341,009
[45] Jul. 27, 1982

[54] METHOD FOR MAKING AN ELECTRICAL CONTACT TO A SILICON SUBSTRATE THROUGH A RELATIVELY THIN LAYER OF SILICON DIOXIDE ON THE SURFACE OF THE SUBSTRATE

[75] Inventors: Robert F. Bartholomew, Poughkeepsie, N.Y.; Paul L. Garbarino, Ridgefield, Conn.; James R. Gardiner, Wappingers Falls, N.Y.; Martin Revitz, Poughkeepsie, N.Y.; Joseph F. Shepard, Hopewell Junction, N.Y.

[73] Assignee: International Business Machines Corporation, Armonk, N.Y.

[21] Appl. No.: 213,526

[22] Filed: Dec. 5, 1980

[51] Int. Cl.³ .......................................... H01L 21/285
[52] U.S. Cl. .................. 29/571; 29/591; 184; 187
[58] Field of Search .................. 29/571, 591; 148/187; 357/91

[56] References Cited

U.S. PATENT DOCUMENTS

| 4,013,489 | 3/1977 | Oldham | 29/589 X |
|---|---|---|---|
| 4,045,594 | 8/1977 | Maddocks | 29/580 X |
| 4,075,045 | 2/1978 | Rideout | 148/187 |
| 4,102,733 | 7/1978 | De La Moneda et al. | 29/571 X |
| 4,148,133 | 4/1979 | Kochel et al. | 29/571 |
| 4,157,269 | 6/1979 | Ning et al. | 148/1.5 |
| 4,180,826 | 12/1979 | Shappir | 29/571 X |
| 4,265,685 | 5/1981 | Seki | 148/187 X |
| 4,270,262 | 6/1981 | Hori et al. | 29/589 X |
| 4,272,880 | 6/1981 | Pashley | 29/571 |
| 4,282,648 | 8/1981 | Yu et al. | 148/187 X |

*Primary Examiner*—G. Ozaki
*Attorney, Agent, or Firm*—Frank C. Leach, Jr.; George O. Saile

[57] ABSTRACT

A buried electrical contact is made to a substrate of monocrystalline silicon through a relatively thin layer of silicon dioxide without causing damage to the relatively thin layer of silicon dioxide. This is accomplished through depositing a thin layer of polycrystalline silicon over the relatively thin layer of silicon dioxide prior to forming the opening in the relatively thin layer of silicon dioxide for the electrical contact to the substrate. After the thin layer of polycrystalline silicon is deposited, an opening is formed therein so that the thin layer of polycrystalline silicon functions as a mask to etch a corresponding opening in the relatively thin layer of silicon dioxide. Then, a layer of polycrystalline silicon is deposited over the exposed surface of the substrate and the thin layer of polycrystalline silicon to form the electrical contact through the opening in the relatively thin layer of silicon dioxide to the substrate.

11 Claims, 21 Drawing Figures

METHOD FOR MAKING AN ELECTRICAL CONTACT TO A SILICON SUBSTRATE THROUGH A RELATIVELY THIN LAYER OF SILICON DIOXIDE ON THE SURFACE OF THE SUBSTRATE

TECHNICAL FIELD

This invention relates to a method for forming an electrical contact to a substrate of silicon through a relatively thin layer of silicon dioxide.

BACKGROUND ART

The formation of a buried contact through a relatively thin layer of silicon dioxide, which functions as a gate oxide for a field effect transistor (FET), for example, on a surface of a silicon substrate has previously been accomplished through depositing a layer of photoresist on the relatively thin layer of silicon dioxide on the substrate and then forming an opening in the layer of photoresist by a conventional photolithographic technique. This enables the photoresist layer to function as a mask for forming the opening in the relatively thin layer of silicon dioxide through which an electrical contact is to be made to the silicon substrate. After the opening has been formed in the layer of photoresist, the relatively thin layer of silicon dioxide has been etched by a suitable etchant such as a buffered hydrofluoric acid solution, for example.

After etching of the relatively thin layer of silicon dioxide, the layer of photoresist has been removed. During removal of the layer of photoresist, a very thin layer of silicon dioxide has been formed on the exposed surface of the silicon substrate. This very thin layer varies in thickness from 15 Å to 30 Å depending on the procedure employed to remove the photoresist. If a wet etch is used to remove the photoresist through employing sulfuric acid ($H_2SO_4$) as the etchant, for example, the oxygen in the etchant reacts with the silicon substrate to form a layer of silicon dioxide having a thickness of approximately 15 Å to 25 Å. When a dry etch is utilized in which oxygen plasma is employed as the etchant, for example, the oxygen reacts with the exposed surface of the silicon substrate to form a layer of silicon dioxide having a thickness of approximately 25 Å to 30 Å.

This very thin layer of silicon dioxide can cause an increase in the resistance of the contact if it is not removed because of its electrical insulation property. Thus, this increase in the resistance would prevent the contact from functioning satisfactorily so that the end product is defective.

If the very thin layer of silicon dioxide is removed by a buffered hydrofluoric acid solution, for example, to avoid the increase in resistance of the contact, the relatively thin layer of silicon dioxide through which the contact opening has been formed is etched to a degree. This can degrade the layer of silicon dioxide sufficiently through reducing its thickness so that it may no longer function satisfactorily as a gate oxide layer, for example, in a FET.

The relatively thin layer of silicon dioxide cannot have its thickness increased to compensate for the removal of silicon dioxide therefrom at the time that the very thin layer of silicon dioxide is removed by a buffered hydrofluoric acid solution. This is because the amount of reduction of thickness of a layer of silicon dioxide cannot be controlled to the degree necessary to obtain the desired final thickness of the relatively thin layer of silicon dioxide so that it may function as a gate oxide, for example. Furthermore, this type of removal of silicon dioxide can produce defects therein. Accordingly, it is not possible to make the relatively thin layer of silicon dioxide, which is to function as a gate oxide, for example, slightly thicker to compensate for removal of a portion thereof when the very thin layer of silicon dioxide is removed from the substrate surface.

SUMMARY OF THE INVENTION

The method of the present invention satisfactorily overcomes the foregoing problems through protecting the relatively thin layer of silicon dioxide during formation of the electrical contact opening therethrough to the silicon substrate. Thus, with the method of the present invention, the layer of photoresist is removed prior to removal of any of the relatively thin layer of silicon dioxide from the surface of the silicon substrate to which the opening is to be made through the relatively thin layer of silicon dioxide.

The method of the present invention employs a protective layer between the layer of photoresist and the relatively thin layer of silicon dioxide. The protective layer has an opening for the contact formed therein through the photoresist, but there is no opening formed at this time in the relatively thin layer of silicon dioxide on the surface of the substrate. Therefore, when the layer of photoresist is removed, it cannot react with the silicon of the substrate to form a thin layer of silicon dioxide since the silicon substrate is protected by the relatively thin layer of silicon dioxide extending thereover.

Then, the protective layer is used as a mask to etch the opening through the relatively thin layer of silicon dioxide to the surface of the substrate. By forming the protective layer of polycrystalline silicon, it is not necessary to remove the polycrystalline silicon after the opening has been formed in the relatively thin layer of silicon dioxide. Instead, additional polycrystalline silicon is deposited over the thin layer of polycrystalline silicon and the exposed surface of the substrate to function as the electrical contact to the substrate.

An object of this invention is to provide a method of making a buried contact opening to a substrate of silicon having a relatively thin layer of silicon dioxide thereon without damage to the relatively thin layer of silicon dioxide.

Another object of this invention is to provide a method of protecting a gate oxide on a substrate of silicon during formation of an electrical contact to the substrate.

The foregoing and other objects, features, and advantages of the invention will be more apparent from the following more particular description of the preferred embodiment of the invention as illustrated in the accompanying drawings.

DETAILED DESCRIPTION OF PREFERRED EMBODIMENT

Figure 1:
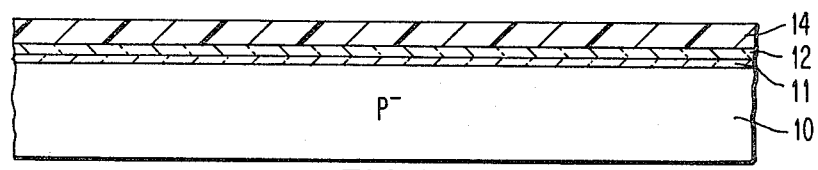
FIGS. 1-21 are fragmentary diagrammatic sectional views of a portion of a substrate showing various stages of formation of a buried contact by the method of the present invention.

Referring to the drawings and particularly FIG. 1, there is shown a substrate 10 of monocrystalline silicon having a layer 11 of silicon dioxide formed thereon. The layer 11 of silicon dioxide is preferably thermally grown on the surface of the substrate 10 to a thickness in the range of 100 Å to 1,000 Å and preferably a thickness of 400 Å. If desired, the layer 11 of silicon dioxide may be deposited by chemical vapor deposition (CVD).

After the layer 11 of silicon dioxide has been deposited on the substrate 10, a layer 12 of silicon nitride is deposited by CVD on top of the layer 11 of silicon dioxide. The layer 12 of silicon nitride has a thickness in the range of 1,000 Å to 2,000 Å and preferably a thickness of approximately 1,000 Å.

Figure 2:
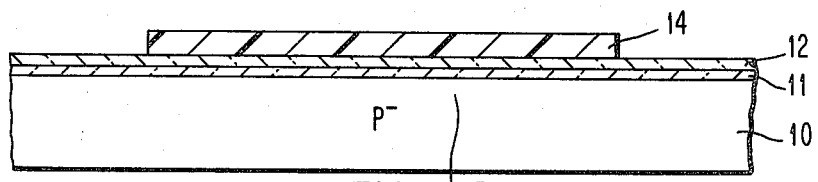

After the layer 12 of silicon nitride is deposited, a layer 14 of photoresist is deposited on the layer 12 of silicon nitride through a blanket coating. The layer 14 of photoresist is then subjected to a pattern exposure so that development of the photoresist of the layer 14 produces portions of the layer 14 of photoresist as shown in FIG. 2.

These remaining portions of the layer 14 of photoresist function as a mask to enable etching of the layer 12 of silicon nitride and the layer 11 of silicon dioxide in the areas not protected by the remaining portions of the layer 14 of photoresist. This etching may be either a wet etch or a dry etch.

With a wet etch, the layer 12 of silicon nitride is etched by a solution of hot phosphoric acid ($H_3PO_4$). Then, the remaining portions of the layer 14 of photoresist are stripped by a solvent or oxygen plasma, for example.

Figure 3:
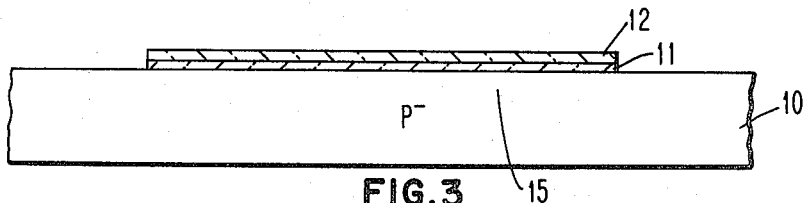

After the remaining portions of the layer 14 of photoresist have been stripped from the remaining portions of the layer 12 of silicon nitride, the remaining portions of the layer 12 of silicon nitride function as a mask to enable etching of the layer 11 of silicon dioxide by a buffered hydrofluoric acid solution, which may be a 7:1 solution, for example. This produces the structure shown in FIG. 3 in which the remaining portions of the layer 11 of silicon dioxide and the layer 12 of silicon nitride are disposed over spaced areas of the substrate 10 that are to have devices formed therein so as to function as device regions 15. Thus, a device could be formed in each of the regions 15 in the substrate 10 and could be a FET, for example.

When a dry etch is utilized, the portion of the layer 12 of silicon nitride not protected by the remaining portions of the layer 14 of photoresist is etched by a plasma of carbon tetrafluoride ($CF_4$) and oxygen ($O_2$), for example. Then, the substrate 10 is dip etched in a buffered hydrofluoric acid solution, which may be a 7:1 solution, for example, to remove the portions of the layer 11 of silicon dioxide not protected by the remaining portions of the layer 12 of silicon nitride. Then, the remaining portions of the layer 14 of photoresist are stripped from the remaining portions of the layer 12 of silicon nitride in the same manner as when a wet etch is employed.

Figure 4:
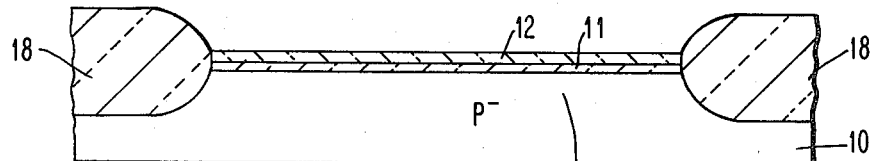

Each of the device regions 15 of the substrate 10 is then electrically isolated by the formation of recessed isolation oxide (ROX) regions 18 (see FIG. 4). The ROX regions 18 are formed by thermal oxidation in the presence of dry oxygen or steam. Preferably, the ROX regions 18 are formed by thermal oxidation in steam at a temperature of about 900° C. to 1,000° C., preferably 950° C., to a thickness of about 4,000 Å to 10,000 Å, preferably 6,500 Å.

The resulting structure at this stage is shown in FIG. 4. As a result, each of the device regions 15 of the substrate 10 is electrically isolated.

Figure 5:
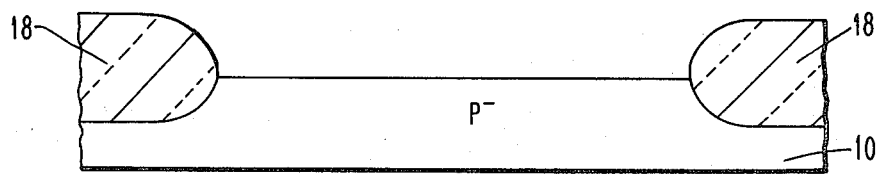

After formation of the ROX regions 18, the remaining portions of the layer 12 of silicon nitride are removed and then the remaining portions of the layer 11 of silicon dioxide are removed to produce the structure of FIG. 5. The remaining portions of the layer 12 of silicon nitride and the layer 11 of silicon dioxide may be etched in the same manner as previously discussed.

Figure 6:
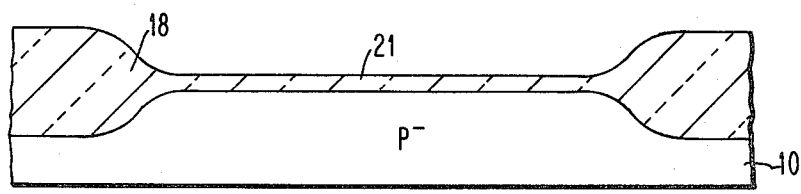

After the exposed areas of the substrate 10 have been cleaned, a relatively thin layer 21 (see FIG. 6) of silicon dioxide is grown on the cleaned areas. The layer 21 of silicon dioxide is preferably grown in the same manner as the layer 12 of silicon dioxide and has a thickness in the range of 250 Å to 500 Å.

Figure 7:
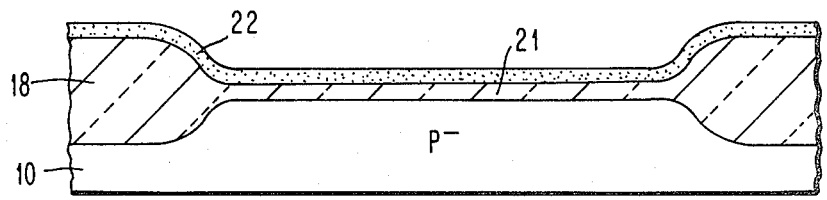

Then, a thin layer 22 (see FIG. 7) of polycrystalline silicon is deposited as a blanket coating over the layer 21 of silicon dioxide and the ROX regions 18. The layer 22 of polycrystalline silicon is deposited by CVD and preferably has a thickness of about 1,000 Å.

The layer 22 of polycrystalline silicon is preferably intrinsic polycrystalline silicon. However, if desired, it could be doped.

Figure 8:
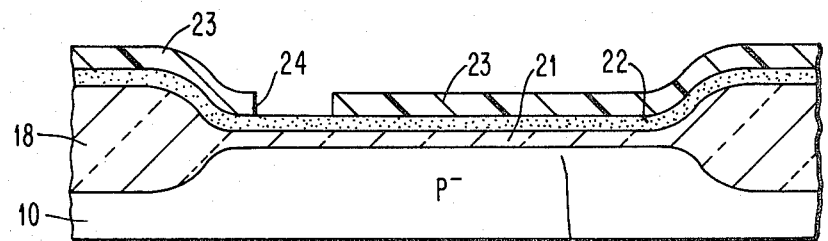

Next, a layer 23 (see FIG. 8) of photoresist is deposited as a blanket coating over the layer 22 of polycrystalline silicon in the same manner as the layer 14 (see FIG. 1) of photoresist was deposited. After the layer 23 (see FIG. 8) of photoresist is deposited, openings 24 (one shown) are formed in the layer 23 of photoresist wherever an electrical contact is to be made to the substrate 10 through removing portions of the layer 23 of photoresist in the same manner as discussed relative to the layer 14 (see FIG. 1) of photoresist. One of the openings 24 (see FIG. 8) may be formed in the layer 23 of photoresist over each of the device regions 15 in the substrate 10.

Figure 9:
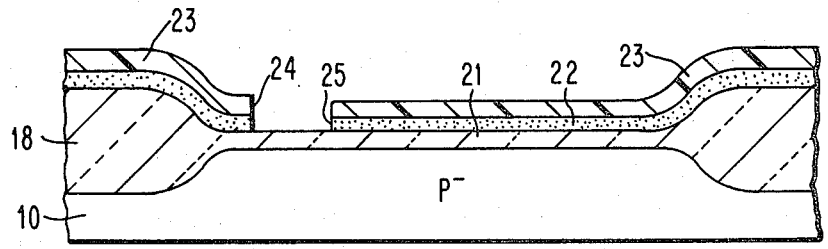

With the remaining portions of the layer 23 of photoresist functioning as a mask, the openings 24 therein are utilized to enable etching of the layer 22 of polycrystalline silicon at each of the openings 24. The layer 22 of polycrystalline silicon has portions removed by a dry etch. The dry etch may be performed with a plasma of carbon tetrafluoride ($CF_4$) and oxygen ($O_2$), for example. As shown in FIG. 9, this etching results in an opening 25 (one shown) being formed in the layer 22 of polycrystalline silicon beneath each of the openings 24 in the layer 23 of photoresist.

Figure 10:
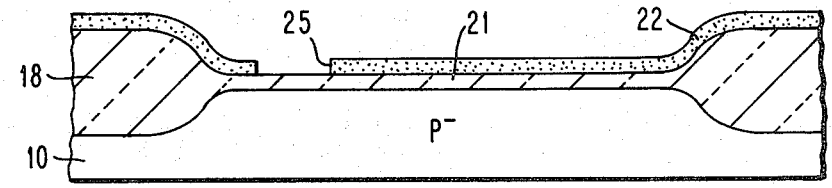

Then, the remaining portions of the layer 23 of photoresist are stripped to leave the structure of FIG. 10. This may be accomplished in the manner previously described for removing the remaining portions of the layer 14 (see FIG. 1) of photoresist.

With the remaining portions of the layer 23 (see FIG. 9) of photoresist removed as shown in FIG. 10, the layer 22 of polycrystalline silicon with the openings 25 (one shown) therein functions as a mask to enable etching of openings 26 (one shown in FIG. 11) in the relatively thin layer 21 of silicon dioxide with each of the openings 26 corresponding to one of the openings 25 in the layer 22 of polycrystalline silicon. The relatively thin layer 21 of silicon dioxide may be etched by a wet etch or a dry etch in the manner previously described for etching the layer 11 (see FIG. 2) of silicon dioxide.

Figure 11:
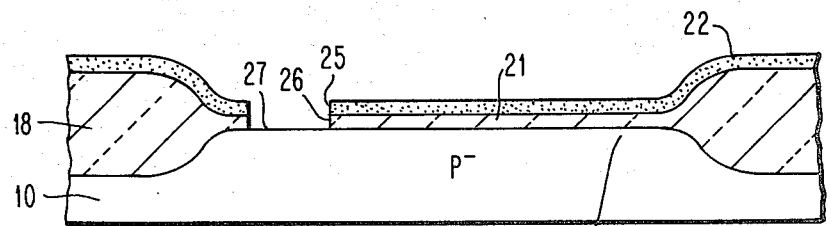

This etching of the relatively thin layer 21 (see FIG. 11) of silicon dioxide produces an exposed area 27 of the surface of the substrate 10 at each of the positions in which one of the openings 26 has been formed in the layer 21 of silicon dioxide. As shown in FIG. 11, only one of the openings 26 is formed in the relatively thin layer 21 of silicon dioxide for each of the device regions 15. Of course, depending on the device within the device region 15, more than one of the openings 26 could be formed in the relatively thin layer 21 of silicon dioxide for contact with the surface of the substrate 10 in one of the device regions 15.

Figure 12:
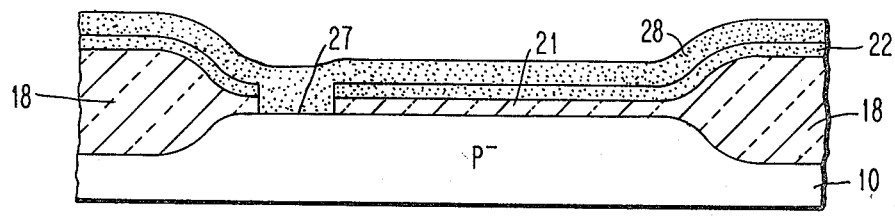

Next, a layer 28 (see FIG. 12) of polycrystalline silicon is deposited as a blanket coating by CVD over the remaining portions of the layer 22 of polycrystalline silicon and the exposed areas 27 of the surface of the substrate 10. The layer 28 of polycrystalline silicon is substantially thicker than the layer 22 of polycrystalline silicon and preferably has a thickness of about 3,000 Å.

The layer 28 of polycrystalline silicon is doped to reduce its resistivity by phosphorus or arsenic, for example, through open tube diffusion or ion implantation, for example. This is to make its conductivity as high as possible since it is to function as a conductor.

As an example of open tube diffusion, the doping of the layer 28 of polycrystalline silicon with phosphorus can be accomplished by using phosphorus oxychloride ($POCl_3$). This phosphorus dopant should have a sufficient concentration or dose to reduce the sheet resistance of the layer 28 of polycrystalline silicon to less than 50 ohms/square.

As an example of ion implantation, the doping of the layer 28 of polycrystalline silicon with arsenic can be accomplished by implanting arsenic ions with a concentration or dose of $5 \times 10^{15}$ atoms/$cm^2$ and 100 KeV energy. This provides a doping level of $10^{20}$ atoms/$cm^3$ to reduce the sheet resistance of the layer 28 of polycrystalline silicon to less than 40 ohms/square.

Figure 13:
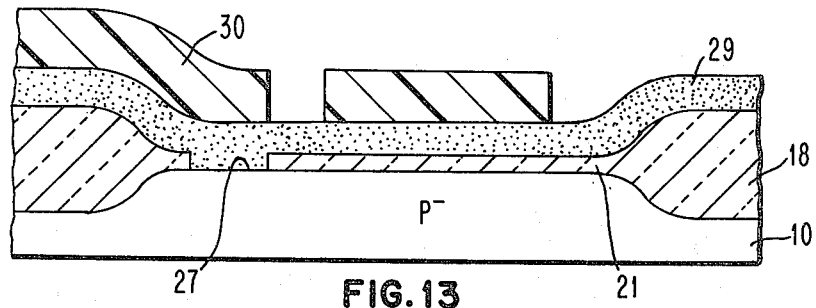

The deposit of the layer 28 of polycrystalline silicon on the layer 22 of polycrystalline silicon results in the layers 22 and 28 of polycrystalline silicon becoming homogeneous. Thus, they behave as a single layer 29 as shown in FIG. 13 and have a sufficient total thickness to reduce the resistance to make the layer 29 of polycrystalline silicon more conductive. It should be understood that doping of the layer 28 of polycrystalline silicon also causes doping of the layer 22 of polycrystalline silicon.

Because the layer 28 (see FIG. 12) of polycrystalline silicon is deposited after the openings 26 (see FIG. 11) have been formed in the relatively thin layer of silicon dioxide 21, the layer 28 (see FIG. 12) of polycrystalline silicon makes good electrical contact with each of the exposed areas 27 of the surface of the substrate 10. Thus, there is no degradation of the relatively thin layer 21 of silicon dioxide because there is no need to remove any silicon dioxide produced when removing the remaining portions of the layer 23 (see FIG. 9) of photoresist since the remaining portions of the layer 23 of photoresist were removed prior to forming the openings 26 (see FIG. 11) in the relatively thin layer 21 of silicon dioxide.

After deposit of the layer 28 (see FIG. 12) of polycrystalline silicon, a layer 30 (see FIG. 13) of photoresist is deposited as a blanket coating over the homogeneous layer 29 of polycrystalline silicon in the same manner as the layer 14 (see FIG. 1) of photoresist was deposited. Then, portions of the layer 30 (see FIG. 13) of photoresist are removed in the same manner as described for removing portions of the layer 14 (see FIG. 2) of photoresist. This removal of portions of the layer 30 (see FIG. 13) of photoresist is in the areas in which it is desired to remove the corresponding portion of the layer 29 of polycrystalline silicon therebeneath. Thus, the remaining portions of the layer 30 of photoresist protect the portions of the layer 29 of polycrystalline silicon that it is desired to have remain.

Therefore, the remaining portions of the layer 30 of photoresist function as a mask. This enables etching of exposed portions of the layer 29 of polycrystalline silicon in the same manner as described for etching the layer 22 (see FIG. 9) of polycrystalline silicon.

Figure 14:
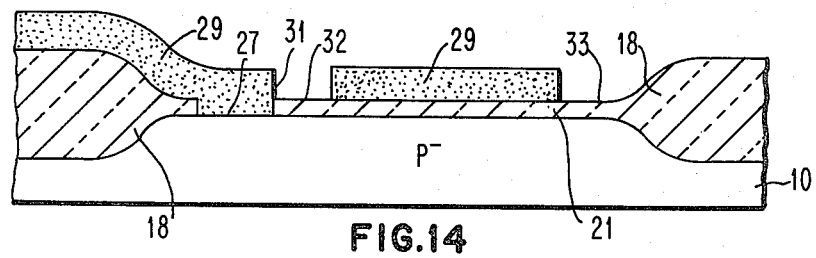

As shown in FIG. 14, the layer 29 of polycrystalline silicon has an opening 31 extending therethrough adjacent the previously exposed area 27 of the substrate 10 with which the layer 29 of polycrystalline silicon is making electrical contact. The opening 31 provides access to an area 32 of the relatively thin layer 21 of silicon dioxide. An area 33 of the relatively thin layer 21 of silicon dioxide also is accessible through portions of the layer 29 of polycrystalline silicon having been removed.

Figure 15:
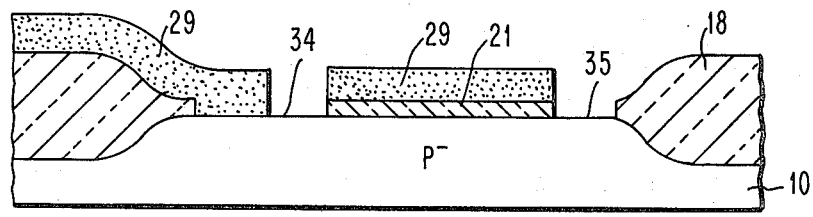

With the areas 32 and 33 of the relatively thin layer 21 of silicon dioxide exposed, the areas 32 and 33 are etched, preferably in a wet etch, in the same manner as previously described for etching the layer 11 (see FIG. 3) of silicon dioxide. This provides exposed areas 34 (see FIG. 15) and 35 of the surface of the substrate 10 on which the relatively thin layer 21 of silicon dioxide is deposited.

Figure 16:
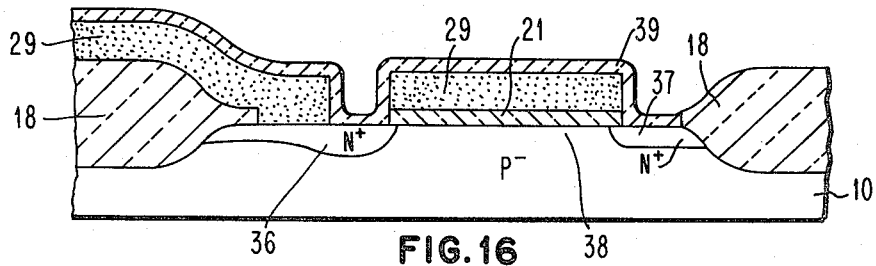

Then, a region 36 (see FIG. 16), which is of opposite conductivity to the conductivity of the substrate 10, is formed within the substrate 10 beneath the exposed area 34 (see FIG. 15) of the surface of the substrate 10 and the portion of the layer 29 of polycrystalline silicon in contact with the surface of the substrate 10 by a suitable diffusion.

Similarly, a region 37 (see FIG. 16), which is the same conductivity as the region 36, is formed in the substrate 10 beneath the exposed area 35 (see FIG. 15) of the surface of the substrate 10 by a suitable diffusion. When the substrate 10 of monocrystalline silicon is of a P− conductivity, each of the regions 36 and 37 has an N+ conductivity.

The regions 36 and 37 are formed by an open tube diffusion or an ion implantation, for example, with the dopant being phosphorus or arsenic, for example. As an example of an open tube diffusion, phosphorus oxychloride ($POCl_3$) is employed to diffuse phosphorus as the dopant into the substrate 10. As an example of ion implantation, arsenic ions having a concentration or dose of about $1 \times 10^{16}$/$cm^2$ and 200 KeV energy are implanted in the silicon substrate 10.

If desired doping of the layer 29 of polycrystalline silicon could occur at the same time that the regions 36 and 37 are formed in the silicon substrate 10. Thus, it is not necessary to dope the layer 28 (see FIG. 12) of polycrystalline silicon separately.

The N+ region 36 functions as a drain region for a FET while the N+ region 37 (see FIG. 15) functions as a source region of the FET. A region 38 (see FIG. 16) of the substrate 10 beneath the relatively thin layer 21 of silicon dioxide and between the regions 36 and 37 functions as a channel region of the FET.

After the regions 36 and 37 have been diffused into the substrate 10, a layer 39 of silicon dioxide is deposited over the diffused regions 36 and 37 and the remaining portions of the layer 29 of polycrystalline silicon. The layer 39 of silicon dioxide is deposited by thermal oxidation in dry oxygen or steam in the same manner as described for the layer 11 (see FIG. 1) of silicon dioxide. The layer 39 (see FIG. 16) of silicon dioxide has a thickness in the range of 500 Å to 3,000 Å.

Figure 17:
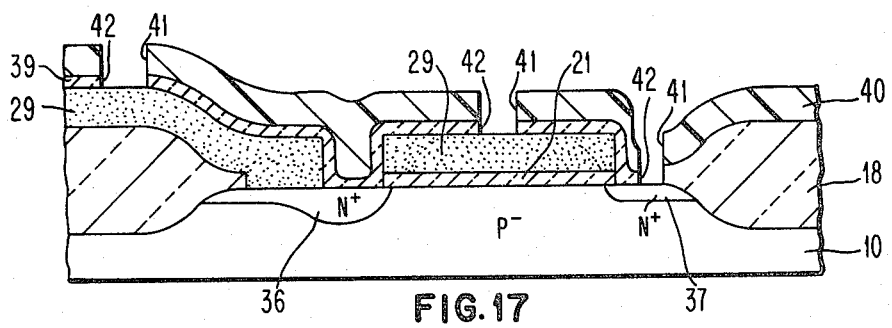

Next, a layer 40 (see FIG. 17) of photoresist is deposited as a blanket coating over the layer 39 of silicon dioxide in the same manner as the layer 14 (see FIG. 1) of photoresist was deposited. Then, openings 41 (see FIG. 17) are formed in the layer 40 of photoresist in the same manner as described for removing portions of the layer 14 (see FIG. 2) of photoresist. This results in the layer 40 (see FIG. 17) of photoresist functioning as a mask for etching openings 42 in the layer 39 of silicon dioxide at locations at which metal contacts are to be made. The openings 42 in the layer 39 of silicon dioxide are formed by a wet etch or a dry etch in the same manner as previously described for etching the layer 11 (see FIG. 3) of silicon dioxide.

Figure 18:
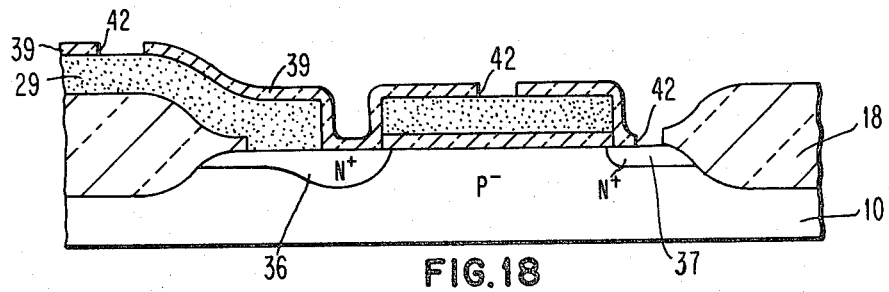

After forming the openings 42 (see FIG. 17) in the layer 39 of silicon dioxide, the remaining portions of the layer 40 of photoresist are stripped to leave the structure of FIG. 18. This stripping may be accomplished in the manner previously described for removing the remaining portions of the layer 14 (see FIG. 2) of photoresist.

The removal of the remaining portions of the layer 40 (see FIG. 17) of photoresist forms a very thin layer of silicon dioxide at each of the exposed areas of the layer 29 of polycrystalline silicon and the exposed portion of the region 37 in the substrate 10. This very thin layer of silicon dioxide is removed by a brief dip etch with a buffered hydrofluoric acid solution, which may be a 7:1 solution, for example. Because the relatively thin layer 21 of silicon dioxide is still protected by the layer 29 of polycrystalline silicon thereover, there is no damage to the relatively thin layer 21 of silicon dioxide.

Figure 19:
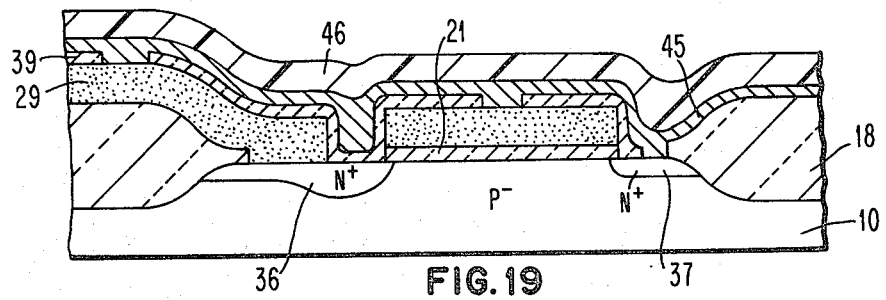

After the remaining portions of the layer 40 of photoresist have been removed, a layer 45 (see FIG. 19) of a conductive metal such as aluminum, for example, is deposited over the substrate 10 as a blanket coating. One suitable means of depositing the layer 45 of metal is by evaporation. The thickness of the layer 45 of metal is typically one micron.

Figure 20:
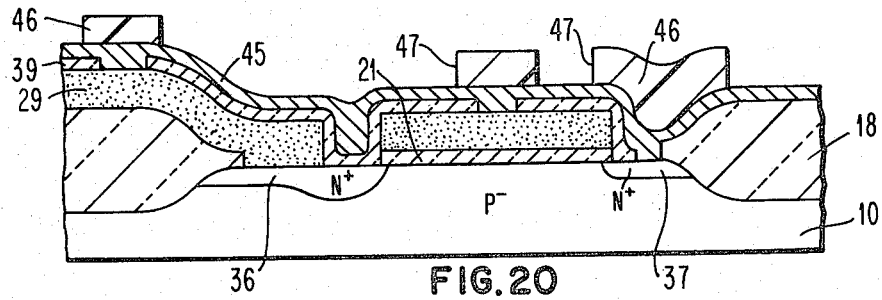

After the layer 45 of metal is deposited, a layer 46 of photoresist is deposited as a blanket coating over the layer 45 of metal in the same manner as the layer 14 (see FIG. 1) of photoresist was deposited. Then, openings 47 (see FIG. 20) in the layer 46 of photoresist are formed wherever it is desired to remove the layer 45 of metal in the same manner as previously described for the layer 14 (see FIG. 2) of photoresist. Thus, the remaining portions of the layer 46 (see FIG. 20) of photoresist are disposed over the portions of the layer 45 of metal that it is desired to not remove.

With the remaining portions of the layer 46 of photoresist functioning as a mask, the openings 47 therein are utilized to enable etching of the layer 45 of metal. The layer 45 of metal is etched by a suitable etchant such as a mixture of phosphoric acid and nitric acid, for example.

Figure 21:
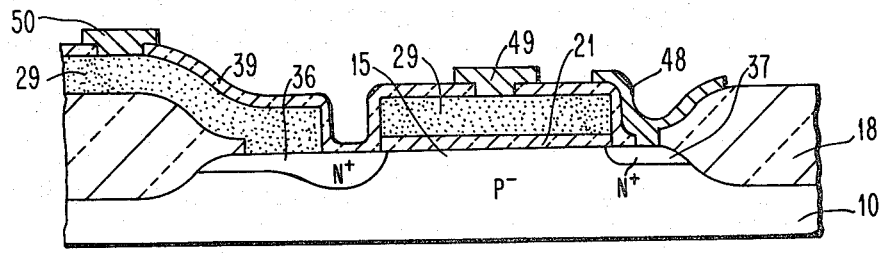

This results in a metallic contact 48 (see FIG. 21) being made with the source region 37, and a metallic contact 49 being made with the portion of the layer 29 of polycrystalline silicon over the relatively thin layer 21 of silicon dioxide, which is functioning as the gate oxide for the channel region 38. Thus, the contact 49 is the gate contact while the contact 48 is the source contact.

A third metal contact 50 engages the portion of the layer 29 of polycrystalline silicon in contact with the drain region 36. Thus, the contact 50 is the drain contact. Therefore, the contact 50 is making the electrical contact through the layer 29 of polycrystalline silicon to the buried contact with the drain region 36.

While the present invention has shown and described the substrate 10 as having a P− conductivity and the regions 36 and 37 having N+ conductivity, it should be understood that the substrate 10 could have an N− conductivity. With this arrangement, each of the regions 36 and 37 would have a P+ conductivity.

While the present invention has shown and described the region 36 as a drain region of an FET and the region 37 as a source region, it should be understood that the region 36 could be a source region and the region 37 could be a drain region if desired. Thus, the buried contact can be with either a source or drain region.

While the present invention has shown and described the device formed in each of the device regions 15 of the substrate 10 as an FET, it should be understood that any other suitable device could be formed in any of the device regions 15 where there is to be a relatively thin layer of silicon dioxide over a portion of the device region 15. Thus, a bipolar transistor, for example, could be formed in one or more of the device regions 15.

An advantage of this invention is that is protects the relatively thin layer of silicon dioxide on the surface of a silicon substrate during formation of a contact opening through the relatively thin layer of silicon dioxide to the substrate surface. Another advantage of this invention is that it prevents formation of silicon dioxide on a surface of a substrate of silicon during formation of an electrical contact opening to the surface of the substrate.

While the invention has been particularly shown and described with reference to a preferred embodiment thereof, it will be understood by those skilled in the art that the foregoing and other changes in form and details may be made therein without departing from the spirit and scope of the invention.

What is claimed is:

1. A method of making at least one electrical contact to a substrate of silicon having a relatively thin layer of silicon dioxide on a surface to which the electrical contact is to be made through the relatively thin layer of silicon dioxide including:

forming a thin layer of polycrystalline silicon over the relatively thin layer of silicon dioxide on the surface of the substrate;

forming at least one opening in the thin layer of polycrystalline silicon where an electrical contact is to be made to the substrate;

etching an opening in the relatively thin layer of silicon dioxide through the opening in the thin layer of polycrystalline silicon to expose the surface of the substrate;

depositing a second layer of polycrystalline silicon over the thin layer of polycrystalline silicon and the exposed surface of the substrate so that the second layer of polycrystalline silicon makes electrical contact with the exposed surface of the substrate through the opening in the relatively thin layer of silicon dioxide;

and doping at least the second layer of polycrystalline silicon to the opposite conductivity of the conductivity of the substrate to provide conductivity thereto so that it can function as an electrical contact to the exposed surface of the substrate.

2. The method according to claim 1 including forming at least the one opening in the thin layer of polycrystalline silicon where the electrical contact is to be made to the substrate by:

forming a photoresist mask over the thin layer of polycrystalline silicon with an opening where the electrical contact is to be made to the substrate;

etching the thin layer of polycrystalline silicon through the opening in the photoresist mask to form a corresponding opening in the thin layer of polycrystalline silicon;

and removing the photoresist mask after etching of the corresponding opening in the thin layer of polycrystalline silicon.

3. The method according to claim 2 in which the thin layer of polycrystalline silicon is intrinsic when formed over the relatively thin layer of silicon dioxide on the surface of the substrate.

4. The method according to claim 3 in which the substrate is monocrystalline silicon.

5. The method according to claim 4 including:

electrically isolating areas of the substrate so that a plurality of the areas has one of the electrical contacts in contact therewith;

forming a first opening through the second layer of polycrystalline silicon, the thin layer of polycrystalline silicon, and the relatively thin layer of silicon dioxide to each of the plurality of electrically isolated areas of the substrate adjacent the exposed surface of the substrate to which the electrical contact has been made by the second layer of polycrystalline silicon;

diffusing a dopant of the opposite conductivity to the conductivity of the substrate through each of the first openings to form one of a drain region and a source region of a field effect transistor within the electrically isolated area of the substrate with which the electrical contact has been made;

forming a second opening through the second layer of polycrystalline silicon, the thin layer of polycrystalline silicon, and the relatively thin layer of silicon dioxide to each of the plurality of electrically isolated areas of the substrate at a position spaced from the exposed surface of the substrate to which the electrical contact is made by the second layer of polycrystalline silicon;

diffusing a dopant of the opposite conductivity to the conductivity of the substrate through each of the second openings to form the other of a drain region and a source region of the field effect transistor within the electrically isolated area of the substrate;

and forming a channel region of the field effect transistor within each of the plurality of electrically isolated areas of the substrate beneath the relatively thin layer of silicon dioxide between the drain and source regions.

6. The method according to claim 1 in which the thin layer of polycrystalline silicon is intrinsic when formed over the relatively thin layer of silicon dioxide on the surface of the substrate.

7. The method according to claim 6 in which the substrate is monocrystalline silicon.

8. The method according to claim 7 including:

electrically isolating areas of the substrate so that a plurality of the areas has one of the electrical contacts in contact therewith;

forming a first opening through the second layer of polycrystalline silicon, the thin layer of polycrystalline silicon, and the relatively thin layer of silicon dioxide to each of the plurality of electrically isolated areas of the substrate adjacent the exposed surface of the substrate to which the electrical contact has been made by the second layer of polycrystalline silicon;

diffusing a dopant of the opposite conductivity to the conductivity of the substrate through each of the first openings to form one of a drain region and a source region of a field effect transistor within the electrically isolated areas of the substrate with which the electrical contact has been made;

forming a second opening through the second layer of polycrystalline silicon, the thin layer of polycrystalline silicon, and the relatively thin layer of silicon dioxide to each of the plurality of electrically isolated areas of the substrate at a position spaced from the exposed surface of the substrate to which the electrical contact is made by the second layer of polycrystalline silicon;

diffusing a dopant of the opposite conductivity to the conductivity of the substrate through each of the second openings to form the other of a drain region and a source region of the field effect transistor within the electrically isolated area of the substrate;

and forming a channel region of the field effect transistor within each of the plurality of electrically isolated areas of the substrate beneath the relatively thin layer of silicon dioxide between the drain and source regions.

9. The method according to claim 1 in which the substrate is monocrystalline silicon.

10. The method according to claim 9 including:

electrically isolating areas of the substrate so that a plurality of the areas has one of the electrical contacts in contact therewith;

forming a first opening through the second layer of polycrystalline silicon, the thin layer of polycrystalline silicon, and the relatively thin layer of silicon dioxide to each of the plurality of electrically isolated areas of the substrate adjacent the exposed surface of the substrate to which the electrical contact has been made by the second layer of polycrystalline silicon;

diffusing a dopant of the opposite conductivity to the conductivity of the substrate through each of the first openings to form one of a drain region and a source region of a field effect transistor within the electrically isolated area of the substrate with which the electrical contact has been made;

forming a second opening through the second layer of polycrystalline silicon, the thin layer of polycrystalline silicon, and the relatively thin layer of silicon dioxide to each of the plurality of electrically isolated areas of the substrate at a position spaced from the exposed surface of the substrate to which the electrical contact is made by the second layer of polycrystalline silicon;

diffusing a dopant of the opposite conductivity to the conductivity of the substrate through each of the second openings to form the other of a drain region and a source region of the field effect transistor within the electrically isolated area of the substrate;

and forming a channel region of the field effect transistor within each of the plurality of electrically isolated areas of the substrate beneath the relatively thin layer of silicon dioxide between the drain and source regions.

11. The method according to claim 1 including:

electrically isolating areas of the substrate so that a plurality of the areas has one of the electrical contacts in contact therewith;

forming a first opening through the second layer of polycrystalline silicon, the thin layer of polycrystalline silicon, and the relatively thin layer of silicon dioxide to each of the plurality of electrically isolated areas of the substrate adjacent the exposed surface of the substrate to which the electrical contact has been made by the second layer of polycrystalline silicon;

diffusing a dopant of the opposite conductivity to the conductivity of the substrate through each of the openings to form one of a drain region and a source region of a field effect transistor within the electrically isolated area of the substrate with which the electrical contact has been made;

forming a second opening through the second layer of polycrystalline silicon, the thin layer of polycrystalline silicon, and the relatively thin layer of silicon dioxide to each of the plurality of electrically isolated areas of the substrate at a position spaced from the exposed surface of the substrate to which the electrical contact is made by the second layer of polycrystalline silicon;

diffusing a dopant of the opposite conductivity to the conductivity of the substrate through each of the second openings to form the other of a drain region and a source region of the field effect transistor within the electrically isolated area of the substrate;

and forming a channel region of the field effect transistor within each of the plurality of the electrically isolated areas of the substrate beneath the relatively thin layer of silicon dioxide between the drain and source regions.

* * * * *